(12) United States Patent
Chih et al.

(10) Patent No.: US 12,340,839 B2
(45) Date of Patent: Jun. 24, 2025

(54) MEMORY DEVICE AND SYSTEM

(71) Applicant: TAIWAN SEMICONDUCTOR MANUFACTURING COMPANY, LTD., Hsinchu (TW)

(72) Inventors: Yu-Der Chih, Hsinchu (TW); Yun-Sheng Chen, Hsinchu County (TW); Jonathan Tsung-Yung Chang, Hsinchu (TW); Hsin-Yuan Yu, Hsinchu County (TW); Chrong Jung Lin, Hsinchu (TW); Ya-Chin King, Taipei (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 179 days.

(21) Appl. No.: 17/716,609

(22) Filed: Apr. 8, 2022

(65) Prior Publication Data

US 2023/0326521 A1    Oct. 12, 2023

(51) Int. Cl.
*G11C 11/54*    (2006.01)

(52) U.S. Cl.
CPC ................... *G11C 11/54* (2013.01)

(58) Field of Classification Search
CPC ...................................... G11C 11/54
USPC .................................... 365/230.05
See application file for complete search history.

(56) References Cited

U.S. PATENT DOCUMENTS

| | | | |
|---|---|---|---|
| 2020/0035305 A1* | 1/2020 | Choi | G11C 11/54 |
| 2021/0408120 A1* | 12/2021 | Lin | H10B 63/20 |
| 2022/0122660 A1* | 4/2022 | Nissan-Cohen | G11C 13/0007 |

OTHER PUBLICATIONS

Park et al., "RRAM-based Synapse for Neuromorphic System with Pattern Recognition Function", 2012 IEEE, International Electron Devices Meeting 12-231, pp. 10.2.1-10.2.4.

\* cited by examiner

*Primary Examiner* — Anthan Tran
(74) *Attorney, Agent, or Firm* — Birch, Stewart, Kolasch & Birch, LLP

(57) ABSTRACT

A memory device includes a first active area, a first doped structure of a first doping type, a second active area, a first gate structure and a second doped structure of a second doping type different from the first doping type. The second active area is disposed between the first active area and the first doped structure. The first gate structure is disposed between the first active area and the second active area in a layout view, and configured to store a first bit with the first active area and the second active area. The second doped structure is coupled to the first gate structure and disposed between the first doped structure and the second active area. The second doped structure and the first doped structure are configured to receive a first signal corresponding to the first bit from the first gate structure.

20 Claims, 6 Drawing Sheets

MEMORY DEVICE AND SYSTEM

BACKGROUND

A neural network is based on a collection of connected units or nodes called artificial neurons, which loosely model the neurons in a biological brain. Each connection, like the synapses in a biological brain, can transmit a signal to other neurons. An artificial neuron receives a signal and then processes it, and can signal neurons connected to it. The "signal" at a connection is a real number, and the output of each neuron is computed by some non-linear function of the sum of its inputs. The connections are called edges. Neurons and edges typically have a weight that adjusts as learning proceeds.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
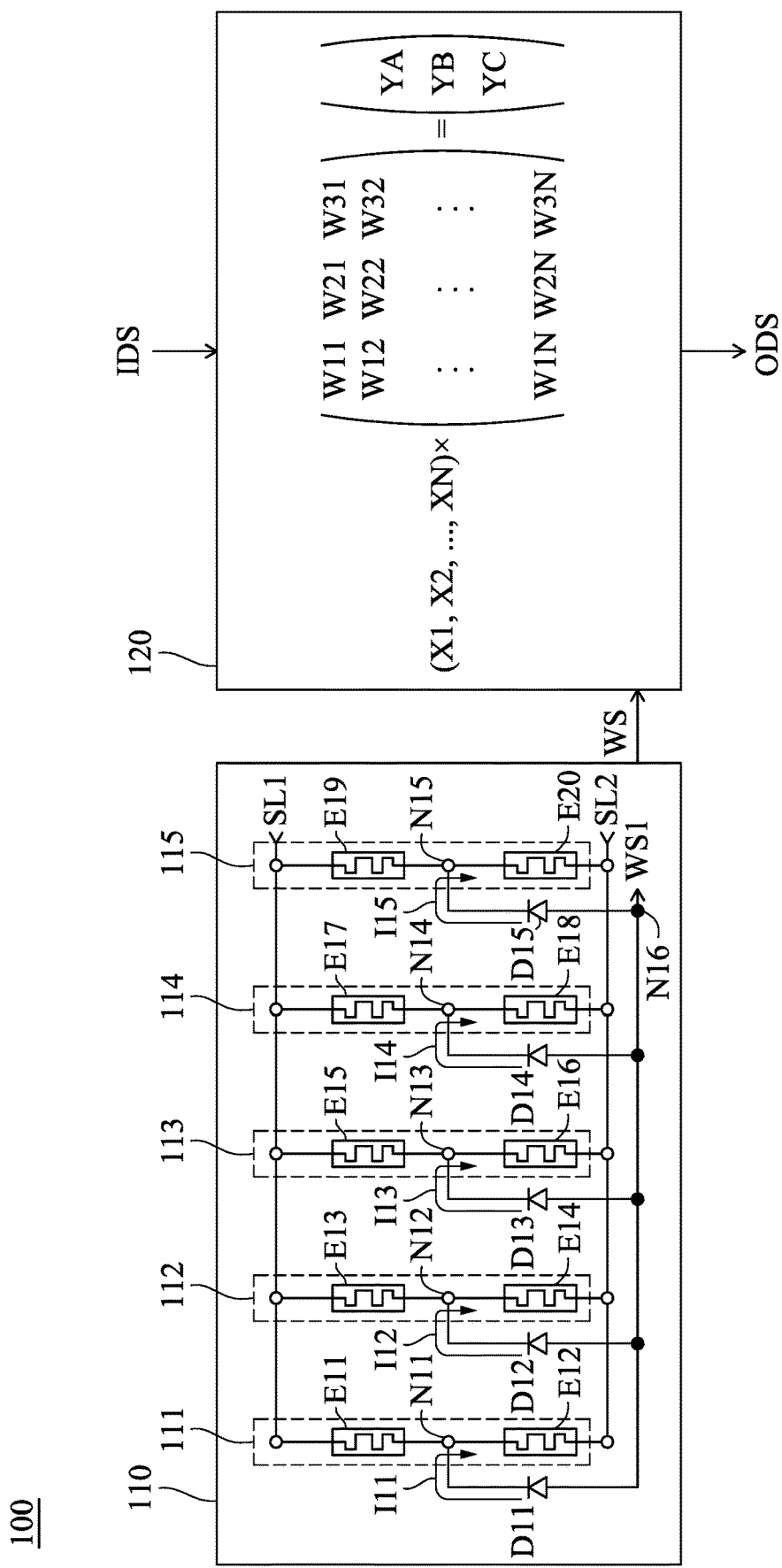
FIG. 1 is a schematic diagram of a system in accordance with some embodiments of the present disclosure.

The following disclosure provides many different embodiments, or examples, for implementing different features of the provided subject matter. Specific examples of components, materials, values, steps, arrangements or the like are described below to simplify the present disclosure. These are, of course, merely examples and are not intended to be limiting. Other components, materials, values, steps, arrangements or the like are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. The term mask, photolithographic mask, photomask and reticle are used to refer to the same item.

The terms applied throughout the following descriptions and claims generally have their ordinary meanings clearly established in the art or in the specific context where each term is used. Those of ordinary skill in the art will appreciate that a component or process may be referred to by different names. Numerous different embodiments detailed in this specification are illustrative only, and in no way limits the scope and spirit of the disclosure or of any exemplified term.

It is worth noting that the terms such as "first" and "second" used herein to describe various elements or processes aim to distinguish one element or process from another. However, the elements, processes and the sequences thereof should not be limited by these terms. For example, a first element could be termed as a second element, and a second element could be similarly termed as a first element without departing from the scope of the present disclosure.

In the following discussion and in the claims, the terms "comprising," "including," "containing," "having," "involving," and the like are to be understood to be open-ended, that is, to be construed as including but not limited to. As used herein, instead of being mutually exclusive, the term "and/or" includes any of the associated listed items and all combinations of one or more of the associated listed items.

FIG. 1 is a schematic diagram of a system 100 in accordance with some embodiments of the present disclosure. In some embodiments, the system 100 includes a memory device 110 and a computing device 120. As illustratively shown in FIG. 1, the memory device 110 is configured to transmit weight signals WS to the computing device 120. The computing device 120 is configured to perform a computing operation to the weight signals WS and input data signals IDS to generate output data signals ODS. In some embodiments, the computing device 120 is implemented by a neural network.

In some embodiments, the memory device 110 includes memory cells 111-115. In some embodiments, the memory cells 111-115 are configured to store bits BT1-BT5, respectively. As illustratively shown in FIG. 1, first terminals of the memory cells 111-115 are configured to receive a voltage signal SL1, and second terminals of the memory cells 111-115 are configured to receive a voltage signal SL2. In some embodiments, the voltage signal SL2 has a ground voltage level, and a voltage level of the voltage signal SL1 is higher than the ground voltage level.

In some embodiments, the memory cell 111 includes memory elements E11 and E12. As illustratively shown in FIG. 1, a first terminal of the memory element E11 is configured to receive the voltage signal SL1, a second terminal of the memory element E11 is coupled to a first terminal of the memory element E12 at a node N11. A second terminal of the memory element E12 is configured to receive the voltage signal SL2.

In some embodiments, the memory cell 112 includes memory elements E13 and E14. As illustratively shown in FIG. 1, a first terminal of the memory element E13 is configured to receive the voltage signal SL1, a second terminal of the memory element E13 is coupled to a first terminal of the memory element E14 at a node N12. A second terminal of the memory element E14 is configured to receive the voltage signal SL2.

In some embodiments, the memory cell 113 includes memory elements E15 and E16. As illustratively shown in FIG. 1, a first terminal of the memory element E15 is configured to receive the voltage signal SL1, a second terminal of the memory element E15 is coupled to a first terminal of the memory element E16 at a node N13. A second terminal of the memory element E16 is configured to receive the voltage signal SL2.

In some embodiments, the memory cell 114 includes memory elements E17 and E18. As illustratively shown in FIG. 1, a first terminal of the memory element E17 is configured to receive the voltage signal SL1, a second terminal of the memory element E17 is coupled to a first terminal of the memory element E18 at a node N14. A second terminal of the memory element E18 is configured to receive the voltage signal SL2.

In some embodiments, the memory cell 115 includes memory elements E19 and E20. As illustratively shown in FIG. 1, a first terminal of the memory element E19 is configured to receive the voltage signal SL1, a second terminal of the memory element E19 is coupled to a first terminal of the memory element E20 at a node N15. A second terminal of the memory element E20 is configured to receive the voltage signal SL2.

In some embodiments, in response to the bit BT1 having a first logic value, such as a logic value of 0, the memory element E11 has a first resistance, the memory element E12 has a second resistance, and the node N11 has a corresponding voltage level VL1. In response to the bit BT1 having a second logic value, such as a logic value of 1, the memory element E11 has the second resistance, the memory element E12 has the first resistance, and the node N11 has a corresponding voltage level VL2.

In some embodiments, in response to the bit BT1, the memory cell 111 is configured to generate a current signal I11 corresponding to the voltage level of the node N11. In some embodiments, a current level of the current signal I11 indicates the logic value of the bit BT1. In some embodiments, the first resistance is higher than the second resistance. In some embodiments, the voltage level VL1 is lower than the voltage level VL2.

Similarly, in some embodiments, in response to the bit BT2 having the first logic value, the memory element E13 has the first resistance, the memory element E14 has the second resistance, and the node N12 has the voltage level VL1. In response to the bit BT2 having the second logic value, the memory element E13 has the second resistance, the memory element E14 has the first resistance, and the node N12 has the voltage level VL2. In some embodiments, in response to the bit BT2, the memory cell 112 is configured to generate a current signal I12 corresponding to the voltage level of the node N12. In some embodiments, a current level of the current signal I12 indicates the logic value of the bit BT2.

Configurations and operations of the memory cells 113-115 are similar with configurations and operations of the memory cell 111. Each of the memory elements E15, E17 and E19 correspond to the memory element E11, and each of the memory elements E16, E18 and E20 correspond to the memory element E12. Therefore, some descriptions are not repeated for brevity.

In some embodiments, in response to the bit BT3, the memory cell 113 is configured to generate a current signal I13 corresponding to the voltage level of the node N13. In some embodiments, in response to the bit BT4, the memory cell 114 is configured to generate a current signal I14 corresponding to the voltage level of the node N14. In some embodiments, in response to the bit BT5, the memory cell 115 is configured to generate a current signal I15 corresponding to the voltage level of the node N15.

As illustratively shown in FIG. 1, the memory cells 111-115 are configured to cooperate with each other to generate the weight signal WS1 corresponding to the bits BT1-BT5 at a node N16, based on the current signals I11-I15. In some embodiments, the weight signals WS includes the weight signal WS1.

In some embodiments, the memory device 110 further includes diodes D11-D15. As illustratively shown in FIG. 1, a cathode terminal of the diode D11 is coupled to the node N11, and an anode terminal of the diode D11 is coupled to the node N16. A cathode terminal of the diode D12 is coupled to the node N12, and an anode terminal of the diode D12 is coupled to the node N16. A cathode terminal of the diode D13 is coupled to the node N13, and an anode terminal of the diode D13 is coupled to the node N16. A cathode terminal of the diode D14 is coupled to the node N14, and an anode terminal of the diode D14 is coupled to the node N16. A cathode terminal of the diode D15 is coupled to the node N15, and an anode terminal of the diode D15 is coupled to the node N16.

In some embodiments, the diode D11 is configured to cooperate with the memory cell 111 to generate the current signal I11 which flows through the first diode and the memory element E12. The diode D12 is configured to cooperate with the memory cell 112 to generate the current signal I12 which flows through the first diode and the memory element E14. The diode D13 is configured to cooperate with the memory cell 113 to generate the current signal I13 which flows through the first diode and the memory element E16. The diode D14 is configured to cooperate with the memory cell 114 to generate the current signal I14 which flows through the first diode and the memory element E18. The diode D15 is configured to cooperate with the memory cell 115 to generate the current signal I15 which flows through the first diode and the memory element E20.

In embodiments corresponding to FIG. 1, a current level of the weight signal WS1 is approximately equal to a summation of current levels of the current signals I11-I15. In various embodiments, the memory device 110 further includes other memory cells coupled to the node N16, and the weight signal WS1 further corresponds to current signals generated by those memory cells.

In some embodiments, the computing device 120 is configured to perform a matrix multiplication to the input data signal IDS and a weight matrix WM to generate the output data signal ODS. As illustratively shown in FIG. 1, the input data signal IDS includes input data components X1-XN, the output data signal ODS includes output data components YA, YB and YC, and the weight matrix WM includes weight components W11-W1N, W21-W2N and W31-W3N. Accordingly, the output data component YA is equal to $(X1 \times W11 + X2 \times W12 + \ldots + XN \times W1N)$, the output data component YB is equal to $(X1 \times W21 + X2 \times W22 + \ldots + XN \times W2N)$, and the output data component YC is equal to (X1×W31+X2×W32+ . . . +XN×W3N). It is noted that N of the weight components W11-W1N, W21-W2N, W31-W3N and the input data components X1-XN is a positive integer.

In some embodiments, the weight components W11-W1N, W21-W2N and W31-W3N correspond to the weight signals WS. For example, a value of the weight component W11 corresponds to a current value of the weight signal WS1 of the weight signals WS.

In some approaches, a memory device is merely configured to store data bits, and is not configured to generate weight signals.

Compared to the above approaches, in some embodiments of the present disclosure, the memory device 110 is configured to generate the weight signal WS1 having a voltage level or a current level corresponding to the bits BT1-BT5. Accordingly, the computing device 120 configured to receive the weight signal WS1 and perform the computing operation with the weight component W11 having a value corresponding to the bits BT1-BT5. As a result, in response to various values of the bits BT1-BT5, the weight component W11 is able to have various values.

Figure 2:
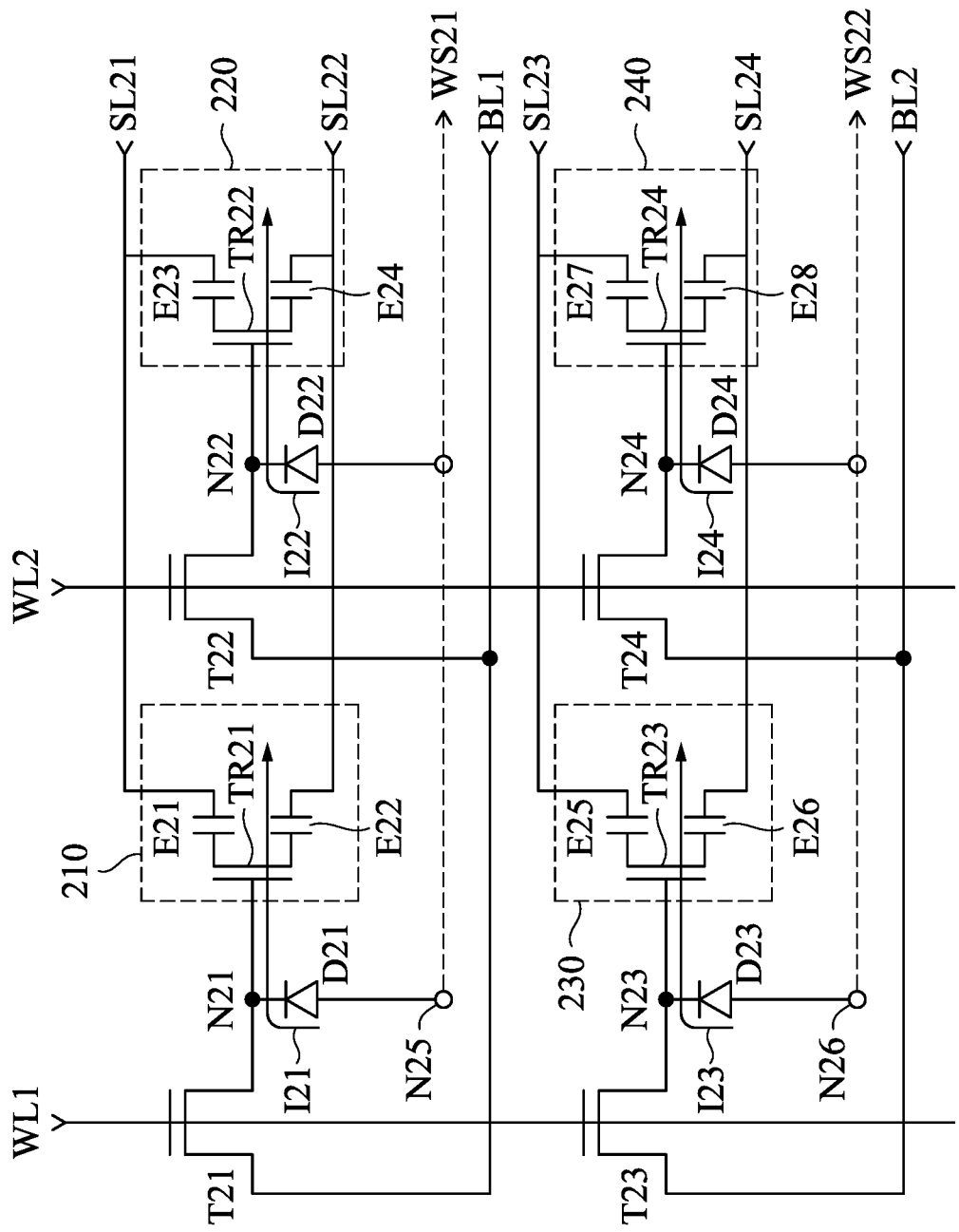
FIG. 2 is a schematic diagram of a memory device corresponding to the memory device shown in FIG. 1, in accordance with some embodiments of the present disclosure.

FIG. 2 is a schematic diagram of a memory device 200 corresponding to the memory device 110 shown in FIG. 1, in accordance with some embodiments of the present disclosure. In some embodiments, the memory device 200 includes memory cells 210, 220, 230, 240, diodes D21-D24 and switches T21-T24. In some embodiments, the memory cells 210, 220, 230 and 240 are configured to store bits BT21-BT24, respectively.

As illustratively shown in FIG. 2, control terminals of the switches T21 and T23 are configured to receive a word line signal WL1, and control terminals of the switches T22 and T24 are configured to receive a word line signal WL2. First terminals of the switches T21 and T22 are configured to receive a bit line signal BL1, and first terminals of the switches T23 and T24 are configured to receive a bit line signal BL2. Second terminals of the switches T21-T24 are coupled to nodes N21-N24, respectively.

As illustratively shown in FIG. 2, cathode terminals of the diodes D21-D24 are coupled to the nodes N21-N24, respectively. Anode terminals of the diodes D21 and D22 are coupled to a node N25. Anode terminals of the diodes D23 and D24 are coupled to a node N26.

In some embodiments, the memory cell 210 includes a transistor TR21 and memory elements E21, E22. As illustratively shown in FIG. 2, a first terminal of the transistor TR21 is coupled to a first terminal of the memory element E21, a second terminal of the transistor TR21 is coupled to a first terminal of the memory element E22, and a control terminal of the transistor TR21 is coupled to the node N21. Second terminals of the memory elements E21 and E22 are configured to receive voltage signals SL21 and SL22, respectively.

In some embodiments, the memory cell 220 includes a transistor TR22 and memory elements E23, E24. As illustratively shown in FIG. 2, a first terminal of the transistor TR22 is coupled to a first terminal of the memory element E23, a second terminal of the transistor TR22 is coupled to a first terminal of the memory element E24, and a control terminal of the transistor TR22 is coupled to the node N22. Second terminals of the memory elements E23 and E24 are configured to receive the voltage signals SL21 and SL22, respectively.

In some embodiments, the memory cell 230 includes a transistor TR23 and memory elements E25, E26. As illustratively shown in FIG. 2, a first terminal of the transistor TR23 is coupled to a first terminal of the memory element E25, a second terminal of the transistor TR23 is coupled to a first terminal of the memory element E26, and a control terminal of the transistor TR23 is coupled to the node N23. Second terminals of the memory elements E25 and E26 are configured to receive voltage signals SL23 and SL24, respectively.

In some embodiments, the memory cell 240 includes a transistor TR24 and memory elements E27, E28. As illustratively shown in FIG. 2, a first terminal of the transistor TR24 is coupled to a first terminal of the memory element E27, a second terminal of the transistor TR24 is coupled to a first terminal of the memory element E28, and a control terminal of the transistor TR24 is coupled to the node N24. Second terminals of the memory elements E27 and E28 are configured to receive the voltage signals SL23 and SL24, respectively.

In some embodiments, the voltage signals SL22 and SL24 have the ground voltage level, and the voltage signals SL21 and SL23 have voltage levels higher than the ground voltage level. In various embodiments, the voltage level of the voltage signal SL21 is approximately equal to or different from the voltage level of the voltage signal SL23.

In some embodiments, the memory elements E21 and E22 are considered as being coupled to each other at the node N21, the memory elements E23 and E24 are considered as being coupled to each other at the node N22, the memory elements E25 and E26 are considered as being coupled to each other at the node N23, and the memory elements E27 and E28 are considered as being coupled to each other at the node N24. Further details of structures of the memory elements E21-E28 are described below in embodiments associated with FIG. 3.

In some embodiments, the diode D21 and the memory cell 210 are configured to generate a current signal I21 corresponding to the bit BT21, the diode D22 and the memory cell 220 are configured to generate a current signal I22 corresponding to the bit BT22, the diode D23 and the memory cell 230 are configured to generate a current signal I23 corresponding to the bit BT23, and the diode D24 and the memory cell 240 are configured to generate a current signal I24 corresponding to the bit BT24.

As illustratively shown in FIG. 2, the current signal I21 flows through the diode D21 and the memory element E22, the current signal I22 flows through the diode D22 and the memory element E24, the current signal I23 flows through the diode D23 and the memory element E26, and the current signal I24 flows through the diode D24 and the memory element E28.

In some embodiments, the memory cells 210, 220 and the diodes D21, D22 are configured to cooperate with each other to generate a weight signal WS21 corresponding to the bits BT21 and BT22 at the node N25, based on the current signals I21 and I22. In some embodiments, the memory cells 230, 240 and the diodes D23, D24 are configured to cooperate with each other to generate a weight signal WS22 corresponding to the bits BT23 and BT24 at the node N26, based on the current signals I23 and I24.

For illustration of FIG. 2 with reference to FIG. 1, the memory device 200 is an embodiment of the memory device 110. The memory cells 210 and 220 correspond to the memory cells 111 and 112, respectively. The memory elements E21-E24 correspond to the memory elements E11-E14, respectively. The diodes D21 and D22 correspond to the diodes D11 and D12, respectively. The voltage signals SL21 and SL22 correspond to the voltage signals SL1 and SL2, respectively. The current signal I21 and I22 correspond to current signal I11 and I12, respectively. The nodes N21 and N22 correspond to the node N11 and N12, respectively. The weight signal WS1 corresponds to the weight signal WS21. Therefore, some descriptions are not repeated for brevity.

For illustration of FIG. 2 with reference to FIG. 1, the computing device 120 is configured to receive the weight signals WS21 and WS22 to perform the computing operation in some embodiments. For example, values of the weight components W11 and W12 correspond to current values of the weight signals WS21 and WS22, respectively.

Figure 3:
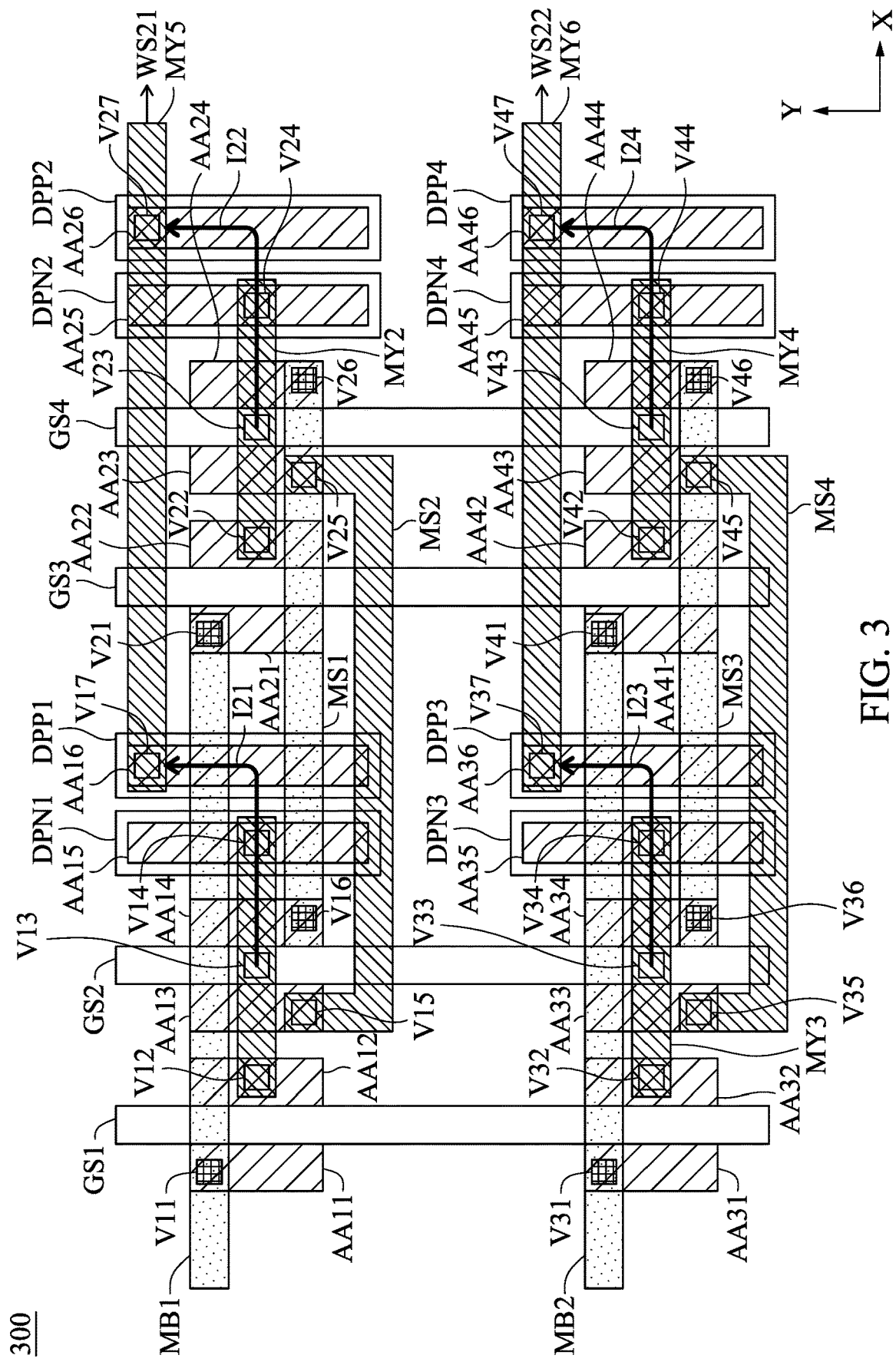
FIG. 3 is a schematic layout of an integrated circuit including structures corresponding to the memory device shown in FIG. 2, in accordance with some embodiments of the present disclosure.

FIG. 3 is a schematic layout 300 of an integrated circuit including structures corresponding to the memory device 200 shown in FIG. 2, in accordance with some embodiments of the present disclosure. In some embodiments, the schematic layout 300 includes doped structures DPN1-DPN4, DPP1-DPP4, active areas AA11-AA16, AA21-AA26, AA31-AA36, AA41-AA46, gate structures GS1-GS4 and conductive structures MY1-MY6, MB1, MB2, MS1-MS4.

As illustratively shown in FIG. 3, the doped structures DPN1-DPN4, DPP1-DPP4, the active areas AA11-AA16, AA21-AA26, AA31-AA36, AA41-AA46, and the gate structures GS1-GS4 extend in, for example, a Y-direction, and the conductive structures MY1-MY6, MB1, MB2, MS1 and MS3 extend in, for example, an X-direction different from the Y-direction. Each of the conductive structures MS2 and MS4 has a U-shape with a long side extends in the X-direction.

As illustratively shown in FIG. 3, the active area AA11, the gate structure GS1, the active areas AA12, AA13, the gate structure GS2, the active area AA14, the doped structures DPN1, DPP1, the active area AA21, the gate structure GS3, the active areas AA22, AA23, the gate structure GS4, the active area AA24 and the doped structures DPN2, DPP2 are arranged in the X-direction in order. The active area AA31, the gate structure GS1, the active areas AA32, AA33, the gate structure GS2, the active area AA34, the doped structures DPN3, DPP3, the active area AA41, the gate structure GS3, the active areas AA42, AA43, the gate structure GS4, the active area AA44 and the doped structures DPN4, DPP4 are arranged in the X-direction in order.

As illustratively shown in FIG. 3, the active area AA15 is disposed on and coupled to the doped structure DPN1, the active area AA16 is disposed on and coupled to the doped structure DPP1, the active area AA25 is disposed on and coupled to the doped structure DPN2, the active area AA26 is disposed on and coupled to the doped structure DPP2, the active area AA35 is disposed on and coupled to the doped structure DPN3, the active area AA36 is disposed on and coupled to the doped structure DPP3, the active area AA45 is disposed on and coupled to the doped structure DPN4, and the active area AA46 is disposed on and coupled to the doped structure DPP4.

As illustratively shown in FIG. 3, the conductive structure MB1 crosses over the active areas AA11 and AA21, is coupled to the active area AA11 through a via V11, and is coupled to the active area AA21 through a via V21. The conductive structure MB2 crosses over the active areas AA31 and AA41, is coupled to the active area AA31 through a via V31, and is coupled to the active area AA41 through a via V41.

As illustratively shown in FIG. 3, the conductive structure MY1 crosses over the gate structure GS2, the active areas AA12 and AA15, is coupled to the gate structure GS2 through a via V13, is coupled to the active area AA12 through a via V12, and is coupled to the active area AA15 through a via V14. The conductive structure MY2 crosses over the gate structure GS4, the active areas AA22 and AA25, is coupled to the gate structure GS4 through a via V23, is coupled to the active area AA22 through a via V22, and is coupled to the active area AA25 through a via V24.

As illustratively shown in FIG. 3, the conductive structure MY3 crosses over the gate structure GS2, the active areas AA32 and AA35, is coupled to the gate structure GS2 through a via V33, is coupled to the active area AA32 through a via V32, and is coupled to the active area AA35 through a via V34. The conductive structure MY4 crosses over the gate structure GS4, the active areas AA42 and AA45, is coupled to the gate structure GS4 through a via V43, is coupled to the active area AA42 through a via V42, and is coupled to the active area AA45 through a via V44.

As illustratively shown in FIG. 3, the conductive structure MY5 crosses over the active areas AA16, AA26 and the doped structures DPP1, DPP2, is coupled to the doped structure DPP1 through a via V17 and the active area AA16, and is coupled to the doped structure DPP2 through a via V27 and the active area AA26. The conductive structure MY6 crosses over the active areas AA36, AA46 and the doped structures DPP3, DPP4, is coupled to the doped structure DPP3 through a via V37 and the active area AA36, and is coupled to the doped structure DPP4 through a via V47 and the active area AA46.

As illustratively shown in FIG. 3, the conductive structure MS1 crosses over the active areas AA14 and AA24, is coupled to the active area AA14 through a via V16, and is coupled to the active area AA24 through a via V26. The conductive structure MS3 crosses over the active areas AA34 and AA44, is coupled to the active area AA34 through a via V36, and is coupled to the active area AA44 through a via V46.

As illustratively shown in FIG. 3, the conductive structure MS2 is coupled to the active area AA13 through a via V15, and is coupled to the active area AA23 through a via V25. The conductive structure MS4 is coupled to the active area AA33 through a via V35, and is coupled to the active area AA43 through a via V45.

For illustration of FIG. 3 with reference to FIG. 2, the active regions AA13, AA14 and the gate structure GS2 correspond to the transistor TR21. The active region AA13 and the gate structure GS2 correspond to the memory element E21. The active region AA14 and the gate structure GS2 correspond to the memory element E22. In some embodiments, the resistance of the memory element E21 is approximately equal to a resistance between the active region AA13 and the gate structure GS2, and the resistance of the memory element E21 is approximately equal to a resistance between the active region AA14 and the gate structure GS2.

Similarly, the active regions AA23, AA24 and the gate structure GS4 correspond to the transistor TR22. The active region AA23 and the gate structure GS4 correspond to the memory element E23. The active region AA24 and the gate structure GS4 correspond to the memory element E24. In some embodiments, the resistance of the memory element E23 is approximately equal to a resistance between the active region AA23 and the gate structure GS4, and the resistance of the memory element E24 is approximately equal to a resistance between the active region AA24 and the gate structure GS4.

Similarly, the active regions AA33, AA34 and the gate structure GS2 correspond to the transistor TR25. The active region AA33 and the gate structure GS2 correspond to the memory element E25. The active region AA34 and the gate structure GS2 correspond to the memory element E26. In some embodiments, the resistance of the memory element E25 is approximately equal to a resistance between the active region AA33 and the gate structure GS2, and the resistance of the memory element E26 is approximately equal to a resistance between the active region AA34 and the gate structure GS2.

Similarly, the active regions AA43, AA44 and the gate structure GS4 correspond to the transistor TR24. The active region AA43 and the gate structure GS4 correspond to the memory element E27. The active region AA44 and the gate structure GS4 correspond to the memory element E28. In some embodiments, the resistance of the memory element E27 is approximately equal to a resistance between the active region AA43 and the gate structure GS4, and the resistance of the memory element E28 is approximately equal to a resistance between the active region AA44 and the gate structure GS4.

For illustration of FIG. 3 with reference to FIG. 2, the doped structures DPN1 and DPP1 are coupled to each other and correspond to the diode D21. The doped structures DPN2 and DPP2 are coupled to each other and correspond to the diode D22. The doped structures DPN3 and DPP3 are coupled to each other and correspond to the diode D23. The doped structures DPN4 and DPP4 are coupled to each other and correspond to the diode D24.

In some embodiments, a doping type of the doped structures DPN1-DPN4 is different from a doping type of the doped structures DPP1-DPP4. For example, the doped structures DPN1-DPN4 are doped with n-type dopants, and the doped structures DPP1-DPP4 are doped with p-type dopants. For illustration of FIG. 3 with reference to FIG. 2, the doped structures DPN1-DPN4 correspond to the cathode terminals of the diodes D21-D24, respectively. The doped structures DPP1-DPP4 correspond to the anode terminals of the diodes D21-D24, respectively.

For illustration of FIG. 3 with reference to FIG. 2, the active regions AA11, AA12 and the gate structure GS1 correspond to the switch T21. The active regions AA21, AA22 and the gate structure GS3 correspond to the switch T22. The active regions AA31, AA32 and the gate structure GS1 correspond to the switch T23. The active regions AA41, AA42 and the gate structure GS3 correspond to the switch T24.

For illustration of FIG. 3 with reference to FIG. 2, the conductive structure MB1 is configured to transmit the bit line signal BL1 to the active areas AA11 and AA21. The conductive structure MB2 is configured to transmit the bit line signal BL2 to the active areas A31 and AA41. The gate structures GS1 and GS3 are configured to receive the word line signals WL1 and WL2, respectively. The conductive structures MS1-MS4 are configured to receive the voltage signals SL22, SL2l, SL24 and SL23, respectively.

In some embodiments, the gate structure GS2 and the active areas AA13 and AA14 are configured to generate the current signal I21 at the gate structure GS2. The via V13, the conductive structure MY1, the via V14, the active area AA15, the doped structures DPN1, DPP1, the active area AA16, the via V17 and the conductive structure MY5 are configured to receive the current signal I21. Alternatively stated, the via V13, the conductive structure MY1, the via V14, the active area AA15, the doped structures DPN1, DPP1, the active area AA16 and the via V17 are configured to transmit the current signal I21 from the gate structure GS2 to the conductive structure MY5.

In some embodiments, the gate structure GS4 and the active areas AA23 and AA24 are configured to generate the current signal I22 at the gate structure GS4. The via V23, the conductive structure MY2, the via V24, the active area AA25, the doped structures DPN2, DPP2, the active area AA26, the via V27 and the conductive structure MY5 are configured to receive the current signal I22. Alternatively stated, the via V23, the conductive structure MY2, the via V24, the active area AA25, the doped structures DPN2, DPP2, the active area AA26 and the via V27 are configured to transmit the current signal I22 from the gate structure GS4 to the conductive structure MY5.

In some embodiments, the gate structure GS2 and the active areas AA33 and AA34 are configured to generate the current signal I23 at the gate structure GS2. The via V33, the conductive structure MY3, the via V34, the active area AA35, the doped structures DPN3, DPP3, the active area AA36, the via V37 and the conductive structure MY6 are configured to receive the current signal I23. Alternatively stated, the via V33, the conductive structure MY3, the via V34, the active area AA35, the doped structures DPN3, DPP3, the active area AA36 and the via V37 are configured to transmit the current signal I23 from the gate structure GS2 to the conductive structure MY6.

In some embodiments, the gate structure GS4 and the active areas AA43 and AA44 are configured to generate the current signal I24 at the gate structure GS4. The via V43, the conductive structure MY4, the via V44, the active area AA45, the doped structures DPN4, DPP4, the active area AA46, the via V47 and the conductive structure MY5 are configured to receive the current signal I24. Alternatively stated, the via V43, the conductive structure MY4, the via V44, the active area AA45, the doped structures DPN4, DPP4, the active area AA46 and the via V47 are configured to transmit the current signal I24 from the gate structure GS4 to the conductive structure MY5.

In some embodiments, the conductive structure MY5 is configured to combine the current signals I21 and I22 to generate the weight signal WS21. The conductive structure MY6 is configured to combine the current signals I23 and I24 to generate the weight signal WS21.

Figure 4:
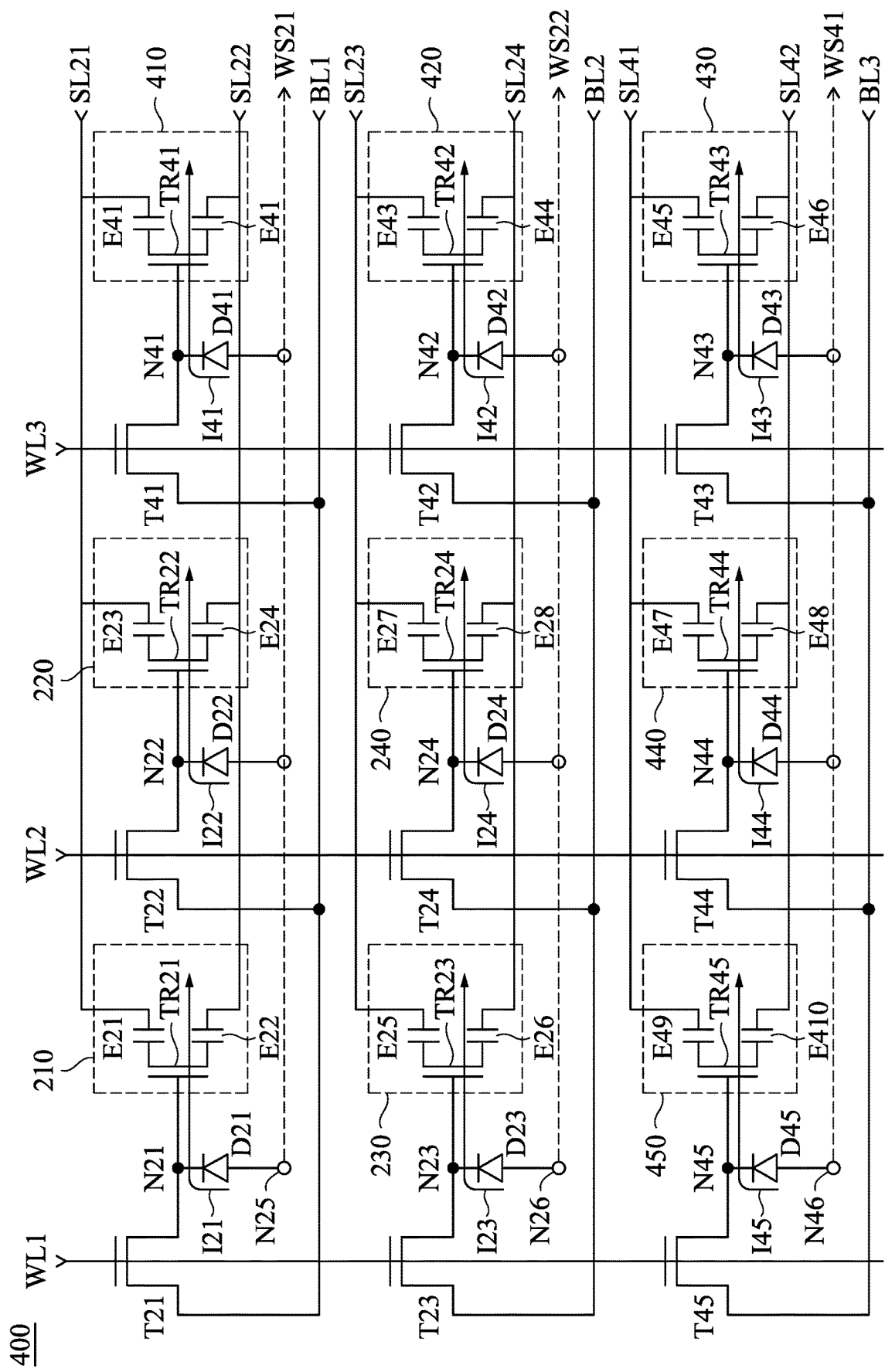
FIG. 4 is a schematic diagram of a memory device corresponding to the memory device shown in FIG. 1, in accordance with some embodiments of the present disclosure.

FIG. 4 is a schematic diagram of a memory device 400 corresponding to the memory device 110 shown in FIG. 1, in accordance with some embodiments of the present disclosure. For illustration of FIG. 4 with reference to FIG. 2, the memory device 400 is an alternative embodiment of the memory device 200. The upper left of the memory device 400 shown in FIG. 4 is similar to the memory device 200 shown in FIG. 2. FIG. 4 follows a similar labeling convention to that of FIG. 2. For brevity, the discussion will focus more on differences between FIG. 2 and FIG. 4 than on similarities.

In some embodiments, the memory device 200 includes memory cells 210, 220, 230, 240, 410, 420, 430, 440, 450, diodes D21-D24, D41-D45 and switches T21-T24, T41-T45. In some embodiments, the memory cells 410, 420, 430, 440 and 450 are configured to store bits BT41-BT45, respectively. Operations and configurations of the memory cells 210, 220, 230, 240, the diodes D21-D24 and the switches T21-T24 are described above with the embodiments associated with FIG. 2 and FIG. 3. Therefore, some descriptions are not repeated for brevity.

As illustratively shown in FIG. 4, control terminals of the switches T41-T43 are configured to receive a word line signal WL3, a control terminal of the switch T44 is configured to receive the word line signal WL2, and a control terminal of the switch T45 is configured to receive the word line signal WL1. First terminals of the switches T43-T45 are configured to receive a bit line signal BL3, a first terminal of the switch T42 is configured to receive the bit line signal BL2, and a first terminal of the switch T41 is configured to receive the bit line signal BL1. Second terminals of the switches T41-T45 are coupled to nodes N41-N45, respectively.

As illustratively shown in FIG. 2, cathode terminals of the diodes D41-D45 are coupled to the nodes N41-N45, respectively. Anode terminals of the diodes D43-D45 are coupled to a node N46. An anode terminal of the diode D41 is coupled to the node N25. An anode terminal of the diode D42 is coupled to the node N26.

In some embodiments, the memory cell 410 includes a transistor TR41 and memory elements E41, E42. As illustratively shown in FIG. 4, a first terminal of the transistor TR41 is coupled to a first terminal of the memory element E41, a second terminal of the transistor TR41 is coupled to a first terminal of the memory element E42, and a control terminal of the transistor TR41 is coupled to the node N41. Second terminals of the memory elements E41 and E42 are configured to receive the voltage signals SL21 and SL22, respectively.

In some embodiments, the memory cell 420 includes a transistor TR42 and memory elements E43, E44. As illustratively shown in FIG. 4, a first terminal of the transistor TR42 is coupled to a first terminal of the memory element E43, a second terminal of the transistor TR42 is coupled to a first terminal of the memory element E44, and a control terminal of the transistor TR42 is coupled to the node N42. Second terminals of the memory elements E43 and E44 are configured to receive the voltage signals SL23 and SL24, respectively.

In some embodiments, the memory cell 430 includes a transistor TR43 and memory elements E45, E46. As illustratively shown in FIG. 4, a first terminal of the transistor TR43 is coupled to a first terminal of the memory element E45, a second terminal of the transistor TR43 is coupled to a first terminal of the memory element E46, and a control terminal of the transistor TR43 is coupled to the node N43. Second terminals of the memory elements E45 and E46 are configured to receive voltage signals SL41 and SL42, respectively.

In some embodiments, the memory cell 440 includes a transistor TR44 and memory elements E47, E48. As illustratively shown in FIG. 4, a first terminal of the transistor TR44 is coupled to a first terminal of the memory element E47, a second terminal of the transistor TR44 is coupled to a first terminal of the memory element E48, and a control terminal of the transistor TR44 is coupled to the node N44. Second terminals of the memory elements E47 and E48 are configured to receive the voltage signals SL41 and SL42, respectively.

In some embodiments, the memory cell 450 includes a transistor TR45 and memory elements E49, E410. As illustratively shown in FIG. 4, a first terminal of the transistor TR45 is coupled to a first terminal of the memory element E49, a second terminal of the transistor TR45 is coupled to a first terminal of the memory element E410, and a control terminal of the transistor TR45 is coupled to the node N45. Second terminals of the memory elements E49 and E410 are configured to receive the voltage signals SL41 and SL42, respectively.

In some embodiments, the voltage signal SL42 has the ground voltage level, and the voltage signal SL41 has a voltage level higher than the ground voltage level. In various embodiments, the voltage level of the voltage signal SL41 is approximately equal to or different from each of the voltage levels of the voltage signal SL23 and SL21.

In some embodiments, the memory elements E41 and E42 are considered as being coupled to each other at the node N41, the memory elements E43 and E44 are considered as being coupled to each other at the node N42, the memory elements E45 and E46 are considered as being coupled to each other at the node N43, the memory elements E47 and E48 are considered as being coupled to each other at the node N44, and the memory elements E49 and E410 are considered as being coupled to each other at the node N45.

In some embodiments, the diode D41 and the memory cell 410 are configured to generate a current signal I41 corresponding to the bit BT41, the diode D42 and the memory cell 420 are configured to generate a current signal I42 corresponding to the bit BT42, the diode D43 and the memory cell 430 are configured to generate a current signal I43 corresponding to the bit BT43, the diode D44 and the memory cell 440 are configured to generate a current signal I44 corresponding to the bit BT44, and the diode D45 and the memory cell 450 are configured to generate a current signal I45 corresponding to the bit BT45.

As illustratively shown in FIG. 4, the current signal I41 flows through the diode D41 and the memory element E42, the current signal I42 flows through the diode D42 and the memory element E44, the current signal I43 flows through the diode D43 and the memory element E46, the current signal I44 flows through the diode D44 and the memory element E48, and the current signal I45 flows through the diode D45 and the memory element E410.

In some embodiments, the memory cells 210, 220, 410 and the diodes D21, D22, D41 are configured to cooperate with each other to generate the weight signal WS21 corresponding to the bits BT21, BT22 and BT41 at the node N25, based on the current signals I21, I22 and I41. In some embodiments, the memory cells 230, 240, 420 and the diodes D23, D24, D42 are configured to cooperate with each other to generate the weight signal WS22 corresponding to the bits BT23, BT24 and BT42 at the node N26, based on the current signals I23, I24 and I42. In some embodiments, the memory cells 430, 440, 450 and the diodes D43, D44, D45 are configured to cooperate with each other to generate a weight signal WS41 corresponding to the bits BT43, BT44 and BT45 at the node N46, based on the current signals I43, I44 and I45.

For illustration of FIG. 4 with reference to FIG. 1, the memory device 400 is an embodiment of the memory device 110. In some embodiments, the computing device 140 is configured to receive the weight signals WS21, WS22 and WS41 to perform the computing operation. For example, values of the weight components W11, W12 and W13 correspond to current values of the weight signals WS21, WS22 and WS41, respectively.

Figure 5:
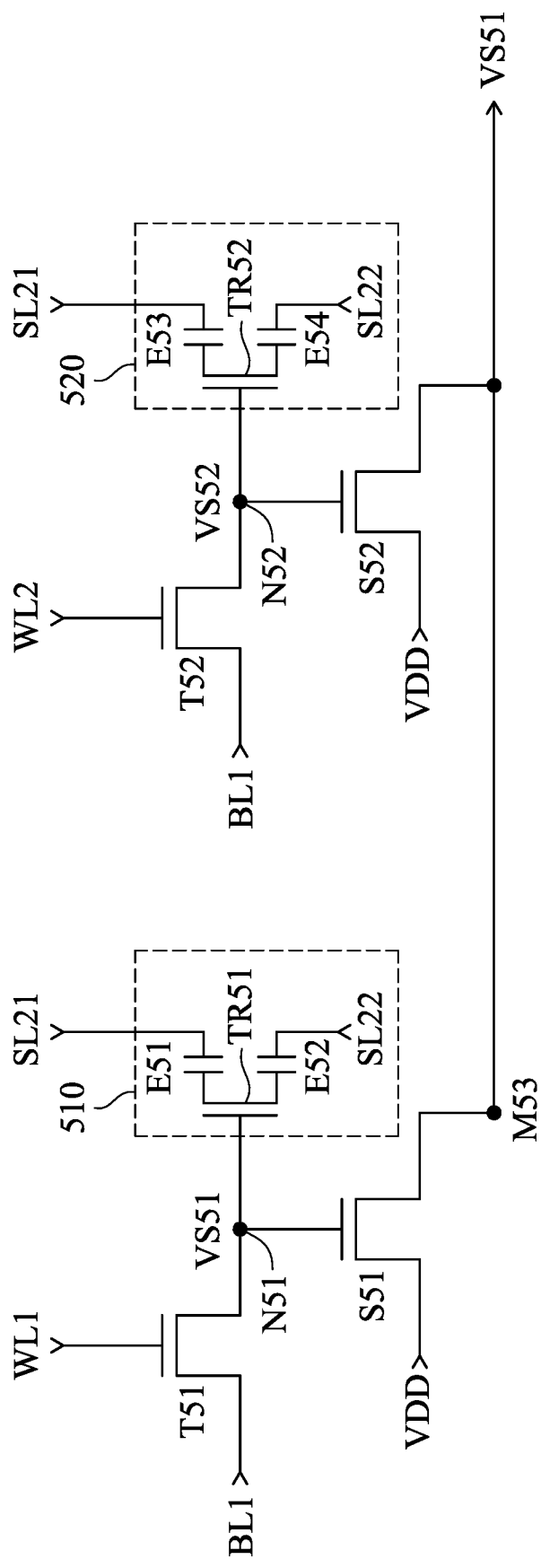
FIG. 5 is a schematic diagram of a memory device corresponding to the memory device shown in FIG. 1, in accordance with some embodiments of the present disclosure.

FIG. 5 is a schematic diagram of a memory device 500 corresponding to the memory device 110 shown in FIG. 1, in accordance with some embodiments of the present disclosure. In some embodiments, the memory device 500 includes memory cells 510, 520, and switches T51, T52, S51, S52. In some embodiments, the memory cells 510 and 520 are configured to store bits BT51 and BT52, respectively.

As illustratively shown in FIG. 5, a control terminals of the switch T51 is configured to receive the word line signal WL1, and a control terminal of the switch T52 is configured to receive the word line signal WL2. A first terminal of the switch T51 is configured to receive the bit line signal BL1, and a first terminal of the switch T52 is configured to receive the bit line signal BL1. Second terminals of the switches T51 and T52 are coupled to nodes N51 and N52, respectively.

As illustratively shown in FIG. 5, control terminals of the switches S51 and S52 are coupled to nodes N51 and N52, respectively. First terminals of the switches S51 and S52 are configured to receive a reference voltage signal VDD.

In some embodiments, the memory cell 510 includes a transistor TR51 and memory elements E51, E52. As illustratively shown in FIG. 5, a first terminal of the transistor TR51 is coupled to a first terminal of the memory element E51, a second terminal of the transistor TR51 is coupled to a first terminal of the memory element E52, and a control terminal of the transistor TR51 is coupled to the node N51. Second terminals of the memory elements E51 and E52 are configured to receive the voltage signals SL21 and SL22, respectively.

In some embodiments, the memory cell 520 includes a transistor TR52 and memory elements E53, E54. As illustratively shown in FIG. 5, a first terminal of the transistor TR52 is coupled to a first terminal of the memory element E53, a second terminal of the transistor TR52 is coupled to a first terminal of the memory element E54, and a control terminal of the transistor TR52 is coupled to the node N52. Second terminals of the memory elements E53 and E54 are configured to receive the voltage signals SL21 and SL22, respectively.

In some embodiments, the memory elements E51 and E52 are considered as being coupled to each other at the node N51, and the memory elements E53 and E54 are considered as being coupled to each other at the node N52.

In some embodiments, the diode D51 and the memory cell 510 are configured to generate a voltage signal VS51 corresponding to the bit BT51, the diode D52 and the memory cell 520 are configured to generate a voltage signal VS52 corresponding to the bit BT52.

As illustratively shown in FIG. 5, the switch S51 is configured to generate a current signal I51 based on the voltage signal VS51. The switch S52 is configured to generate a current signal I52 based on the voltage signal VS52. In some embodiments, a current level of the current signal I51 is increased when a voltage level of the voltage signal VS51 is increased, and a current level of the current signal I52 is increased when a voltage level of the voltage signal VS52 is increased.

In some embodiments, the memory cells 510, 520 and the switches S51, S52 are configured to cooperate with each other to generate a weight signal WS51 corresponding to the bits BT51 and BT52 at the node M53, based on the voltage signals VS51 and VS52. In some embodiments, a voltage level of the reference voltage signal VDD is higher than a voltage level of the node M53.

For illustration of FIG. 5 with reference to FIG. 1, the memory device 500 is an embodiment of the memory device 110. The memory cells 510 and 520 correspond to the memory cells 111 and 112, respectively. The memory elements E51-E54 correspond to the memory elements E11-E14, respectively. The voltage signal VS51 and VS52 correspond to current signal I11 and I15, respectively. The nodes N51 and N52 correspond to the node N11 and N12, respectively. The weight signal WS1 corresponds to the weight signal WS51. Therefore, some descriptions are not repeated for brevity.

For illustration of FIG. 5 with reference to FIG. 1, the computing device 150 is configured to receive the weight signal WS51 to perform the computing operation in some embodiments. For example, the value of the weight component W11 corresponds to a current value of the weight signal WS51.

Figure 6:
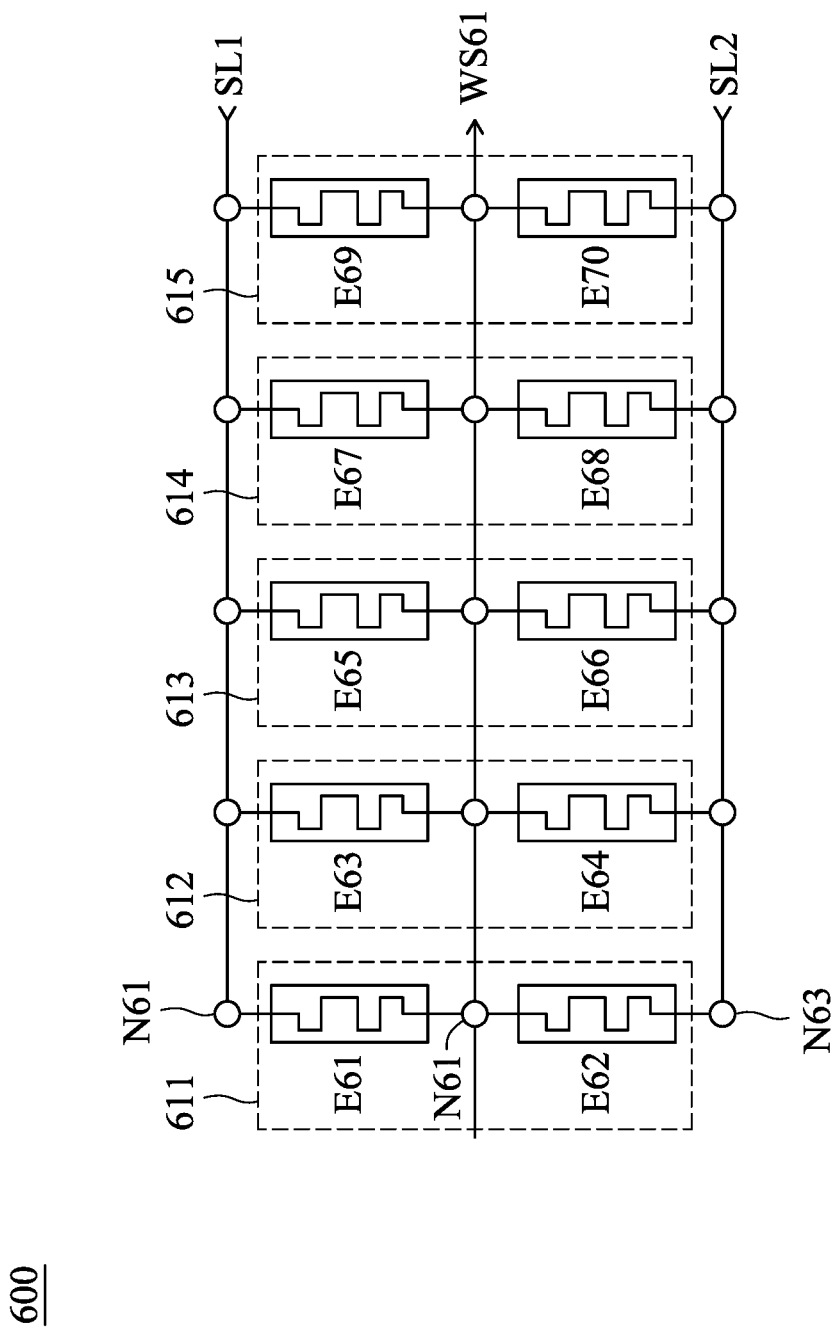
FIG. 6 is a schematic diagram of a memory device corresponding to the memory device shown in FIG. 1, in accordance with some embodiments of the present disclosure.

FIG. 6 is a schematic diagram of a memory device 600 corresponding to the memory device 110 shown in FIG. 1, in accordance with some embodiments of the present disclosure. In some embodiments, the memory device 600 includes memory cells 611-615. In some embodiments, the memory cells 611-615 are configured to store bits BT61-BT65, respectively.

As illustratively shown in FIG. 6, first terminals of the memory cells 611-615 are configured to receive the voltage signal SL1 at a node N62, and second terminals of the memory cells 611-615 are configured to receive a voltage signal SL2 at a node N63. The memory cells 611-615 are configured to cooperate with each other to generate a weight signal WS61 at the node N61.

For illustration of FIG. 6 with reference to FIG. 1, the memory device 400 is an alternative embodiment of the memory device 110. The memory cells 611-615 correspond to the memory cells 111-115, respectively. The weight signal WS61 corresponds to the weight signal WS1. Therefore, some descriptions are not repeated for brevity.

In some embodiments, the memory cell 611 includes memory elements E61 and E62. As illustratively shown in FIG. 6, a first terminal of the memory element E61 is configured to receive the voltage signal SL1, a second terminal of the memory element E61 is coupled to a first terminal of the memory element E62 at a node N61. A second terminal of the memory element E62 is configured to receive the voltage signal SL2.

In some embodiments, the memory cell 612 includes memory elements E63 and E64. As illustratively shown in FIG. 6, a first terminal of the memory element E63 is configured to receive the voltage signal SL1, a second terminal of the memory element E63 is coupled to a first terminal of the memory element E64 at the node N61. A second terminal of the memory element E64 is configured to receive the voltage signal SL2.

In some embodiments, the memory cell 613 includes memory elements E65 and E66. As illustratively shown in FIG. 6, a first terminal of the memory element E65 is configured to receive the voltage signal SL1, a second terminal of the memory element E65 is coupled to a first terminal of the memory element E66 at the node N61. A second terminal of the memory element E66 is configured to receive the voltage signal SL2.

In some embodiments, the memory cell 614 includes memory elements E67 and E68. As illustratively shown in FIG. 6, a first terminal of the memory element E67 is configured to receive the voltage signal SL1, a second terminal of the memory element E67 is coupled to a first terminal of the memory element E68 at the node N61. A second terminal of the memory element E68 is configured to receive the voltage signal SL2.

In some embodiments, the memory cell 615 includes memory elements E69 and E70. As illustratively shown in FIG. 6, a first terminal of the memory element E69 is configured to receive the voltage signal SL1, a second terminal of the memory element E69 is coupled to a first terminal of the memory element E70 at the node N61. A second terminal of the memory element E70 is configured to receive the voltage signal SL2.

In some embodiments, in response to the bit BT61 having the first logic value, the memory element E61 has the first resistance, and the memory element E62 has the second resistance. In response to the bit BT61 having the second logic value, the memory element E61 has the second resistance, and the memory element E62 has the first resistance.

Similarly, in response to one of the bits BT62-BT65 having the first logic value, a corresponding one of the memory elements E63, E65, E67 and E69 has the first resistance, and a corresponding one of the memory elements E64, E66, E68 and E70 has the second resistance. In response to one of the bits BT62-BT65 having the second logic value, a corresponding one of the memory elements E63, E65, E67 and E69 has the second resistance, and a corresponding one of the memory elements E64, E66, E68 and E70 has the first resistance.

As illustratively shown in FIG. 1, the memory elements E61, E63, E65, E67 and E69 are coupled in parallel with each other between the nodes N61 and N62. The memory elements E62, E64, E66, E68 and E70 are coupled in parallel with each other between the nodes N61 and N63.

In some embodiments, a voltage level of the weight signal WS61 is determined by a resistance between the nodes N61 and N62 and a resistance between the nodes N61 and N63. In some embodiments, the voltage level of the weight signal WS61 is increased in response to the resistance between the nodes N61 and N62 being decreased, and the voltage level of the weight signal WS61 is increased in response to the resistance between the nodes N61 and N62 being increased. In some embodiments, a value of one of weight components W11-W1N, W21-W2N and W31-W3N shown in FIG. 1 corresponds to the voltage level of the weight signal WS61.

Also disclosed is a system. The system includes first memory cells. The first memory cells include a first memory cell and a second memory cell. The first memory cell is configured to generate a first signal at a first node based on a first bit. The first memory cell includes a first memory element and a second memory element. The second memory element is coupled to the first memory element at the first node, and configured to store the first bit with the first memory element. The second memory cell is configured to generate a second signal at a second node based on a second bit. The second memory cell includes a third memory element and a fourth memory element. The fourth memory element is coupled to the third memory element at the second node, and configured to store the second bit with the third memory element. The first memory cell and the second memory cell are configured to cooperate with each other to generate a first weight signal corresponding to at least the first bit and the second bit, based on at least the first signal and the second signal.

Also disclosed is a memory device. The memory device includes a first active area, a first doped structure of a first doping type, a second active area, a first gate structure and a second doped structure of a second doping type different from the first doping type. The second active area is disposed between the first active area and the first doped structure. The first gate structure is disposed between the first active area and the second active area in a layout view, and configured to store a first bit with the first active area and the second active area. The second doped structure is coupled to the first gate structure and disposed between the first doped structure and the second active area. The second doped structure and the first doped structure are configured to receive a first signal corresponding to the first bit from the first gate structure.

Also disclosed is a method. The method includes: storing a first bit by a first memory element and a second memory element coupled to each other at a first node; generating a first signal corresponding to the first bit based on a current level of the first node or a voltage level of the first node; storing a second bit by a third memory element and a fourth memory element coupled to each other at a second node; generating a second signal corresponding to the second bit based on a current level of the second node or a voltage level of the second node; and combining the first signal and the second signal to generate a first weight signal corresponding to at least the first bit and the second bit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system comprising a plurality of first memory cells and a transistor, wherein the plurality of first memory cells comprises:
   a first memory cell configured to generate a first signal at a first node based on a first bit, the first memory cell comprising:
     a first switch;
     a first memory element; and
     a second memory element coupled to the first memory element at the first node, and configured to store the first bit with the first memory element; and
   a second memory cell configured to generate a second signal at a second node based on a second bit, the second memory cell comprising:
     a third memory element; and
     a fourth memory element coupled to the third memory element at the second node, and configured to store the second bit with the third memory element,
   wherein the first memory cell and the second memory cell are configured to cooperate with each other to generate a first weight signal corresponding to at least the first bit and the second bit, based on at least the first signal and the second signal,
   the first memory element and the second memory element are coupled to two terminals of the first switch, respectively, and
   the transistor is configured to provide a bit line signal to a gate terminal of the first switch according to a word line signal.

2. The system of claim 1, further comprising:
   a first diode, a first terminal of the first diode coupled to the first node; and
   a second diode, a first terminal of the second diode coupled to the second node, a second terminal of the second diode is coupled to a second terminal of the first diode,
   wherein the first weight signal is generated at the second terminal of the first diode.

3. The system of claim 1, further comprising:
   a second switch, a control terminal of the second switch coupled to the second node, a first terminal of the second switch coupled to a first terminal of the first switch,
   wherein the first weight signal is generated at the first terminal of the first switch, and
   a control terminal of the first switch coupled to the first node.

4. The system of claim 1, wherein each of the plurality of first memory cells is configured to generate a corresponding signal, a current level of the first weight signal is approximately equal to a summation of current levels of the corresponding signals of the plurality of first memory cells.

5. The system of claim 1, further comprising:
a plurality of second memory cells, wherein the plurality of second memory cells comprises:
a third memory cell configured to generate a third signal at a third node based on a third bit, the third memory cell comprising:
a fifth memory element; and
a sixth memory element coupled to the fifth memory element at the third node, and configured to store the third bit with the fifth memory element;
a fourth memory cell configured to generate a fourth signal at a fourth node based on a fourth bit, the fourth memory cell comprising:
a seventh memory element; and
an eighth memory element coupled to the seventh memory element at the fourth node, and configured to store the fourth bit with the seventh memory element,
wherein the third memory cell and the fourth memory cell are configured to cooperate with each other to generate a second weight signal corresponding to at least the third bit and the fourth bit, based on at least the third signal and the fourth signal.

6. The system of claim 5, further comprising:
a computing device configured to perform a summation operation based on the first weight signal and the second weight signal, to generate an output data signal corresponding to the first weight signal and the second weight signal.

7. The system of claim 1, wherein the first node is coupled to the second node, and
a voltage level of the first weight signal corresponds to at least the first bit and the second bit.

8. A method, comprising:
storing a first bit by a first memory element and a second memory element coupled to each other at a first node;
generating a first signal corresponding to the first bit based on a current level of the first node or a voltage level of the first node;
storing a second bit by a third memory element and a fourth memory element coupled to each other at a second node;
generating a second signal corresponding to the second bit based on a current level of the second node or a voltage level of the second node; and
combining the first signal and the second signal to generate a first weight signal corresponding to at least the first bit and the second bit,
wherein
generating the first signal comprises:
generating the first signal by a first diode coupled to the first node; and
the first signal flowing through the first diode and one of the first memory element and the second memory element.

9. The method of claim 8, wherein
generating the second signal comprises:
generating the second signal by a second diode coupled to the second node; and
the second signal flowing through the second diode and one of the third memory element and the fourth memory element to a third node, and combining the first signal and the second signal comprises:
receiving the first signal at the third node.

10. The method of claim 8, wherein
generating the first signal comprises:
generating the first signal by a first switch, a control terminal of the first switch coupled to the first node, and
generating the second signal comprises:
generating the second signal by a second switch, a control terminal of the second switch coupled to the second node, a first terminal of the second switch coupled to a first terminal of the first switch.

11. The method of claim 8, wherein the first node and the second node are coupled to each other, and the first weight signal is generated at the first node and the second node.

12. The method of claim 8, further comprising:
providing a bit line signal to a memory cell storing the first bit according to a word line signal.

13. A system, comprising:
a memory device, comprising:
a first memory cell comprising first and second memory elements that are coupled with each other, and configured to generate a first signal based on a first bit stored therein;
a second memory cell comprising third and fourth memory elements that are coupled with each other, and configured to generate a second signal based on a second bit stored therein;
a first diode having a first terminal coupled to a first node between the first and second memory elements; and
a second diode having a first terminal coupled to a second node between the third and fourth memory elements,
wherein the memory device is configured to generate a first weight signal corresponding to at least the first bit and the second bit, based on at least the first signal and the second signal,
a second terminal of the first diode is coupled to a third node configured to output the first weight signal, and
a second terminal of the second diode is coupled to the third node, configured to output the first weight signal, in the memory device.

14. The system of claim 13, wherein the first memory element is configured to receive a first voltage signal, and
the second memory element is configured to receive a second voltage signal different from the first voltage signal,
wherein resistances of the first and second memory elements are different.

15. The system of claim 14, wherein a voltage level of the first voltage signal is greater than a voltage level of the second voltage signal.

16. The system of claim 13, wherein the memory device further comprises:
a first switch, a control terminal of the first switch coupled to the first node coupled to the first and second memory elements; and
a second switch, a control terminal of the second switch coupled to the second node coupled to the third and fourth memory elements, a first terminal of the second switch coupled to a first terminal of the first switch,
wherein the first weight signal is generated at the first terminal of the first switch.

17. The system of claim 13, wherein the memory device further comprises:
- a third memory cell comprising fifth and sixth memory elements that are coupled with each other, and configured to generate a third signal based on a third bit stored therein; and
- a fourth memory cell comprising seventh and eighth memory elements that are coupled with each other, and configured to generate a fourth signal based on a fourth bit stored therein.

18. The system of claim 17, further comprising:
- a computing device configured to perform a summation operation based on the first weight signal and a second weight signal corresponding to the third and fourth signals, to generate an output data signal.

19. The system of claim 13, wherein the memory device further comprises:
- a switch coupled between first terminals of the first to second memory elements,
- wherein a second terminal of the first memory element is coupled to a first voltage, and a second terminal of the second memory element is coupled to a second voltage different from the first voltage.

20. The system of claim 13, further comprising:
- a transistor configured to configured to provide a bit line signal to the first memory cell according to a word line signal.

* * * * *